United States Patent
Nakanishi et al.

(10) Patent No.: US 10,700,489 B2
(45) Date of Patent: Jun. 30, 2020

(54) OPTICAL SEMICONDUCTOR DEVICE, OPTICAL TRANSMITTER MODULE, OPTICAL MODULE, AND OPTICAL TRANSMISSION EQUIPMENT, AND METHOD FOR MANUFACTURING THEREOF

(71) Applicant: Oclaro Japan, Inc., Sagamihara, Kanagawa (JP)

(72) Inventors: Akira Nakanishi, Tokyo (JP); Noriko Sasada, Kanagawa (JP); Takayuki Nakajima, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 121 days.

(21) Appl. No.: 15/935,325

(22) Filed: Mar. 26, 2018

(65) Prior Publication Data

US 2018/0287339 A1    Oct. 4, 2018

(30) Foreign Application Priority Data

Mar. 29, 2017  (JP) .................................. 2017-064377

(51) Int. Cl.
*H01S 5/042* (2006.01)
*H01S 5/227* (2006.01)
(Continued)

(52) U.S. Cl.
CPC ........ *H01S 5/0425* (2013.01); *H01S 5/02276* (2013.01); *H01S 5/22* (2013.01);
(Continued)

(58) Field of Classification Search
CPC .. H01S 5/0425; H01S 5/2275; H01S 5/02276; H01S 5/0421; H01S 5/34313;
(Continued)

(56) References Cited

U.S. PATENT DOCUMENTS

| | | | |
|---|---|---|---|
| 8,900,903 B2 * | 12/2014 | Yoneda | H01S 5/0425 438/22 |
| 2008/0219673 A1 * | 9/2008 | Goh | H04B 10/40 398/135 |
| 2016/0118773 A1 * | 4/2016 | Hayakawa | H01S 5/2202 372/45.01 |

FOREIGN PATENT DOCUMENTS

| | | |
|---|---|---|
| JP | 2011-009456 A | 1/2011 |
| JP | 2012-253205 A | 12/2012 |

\* cited by examiner

*Primary Examiner* — Tony Ko
(74) *Attorney, Agent, or Firm* — Harrity & Harrity, LLP (57) ABSTRACT

Provided is an optical semiconductor device including a semiconductor substrate; a first semiconductor multilayer that is stacked on a first surface side of the semiconductor substrate, has a mesa structure extending along a light emitting direction, and emits light from an exit end surface; an electrode pad portion for wire bonding which is electrically connected to the upper surface of the mesa structure of the first semiconductor multilayer, is disposed on one side of the mesa structure, and is electrically connected to outside; and an electrode pad peripheral portion including a first rising surface which is in contact with the outer edge of the electrode pad portion on the exit end surface side and rises along the stacking direction from the electrode pad portion, in which a lower surface of the electrode pad portion is higher than the upper surface of the mesa structure of the first semiconductor multilayer.

20 Claims, 8 Drawing Sheets

(51) Int. Cl.
| | |
|---|---|
| *H01S 5/022* | (2006.01) |
| *H01S 5/22* | (2006.01) |
| H05K 1/18 | (2006.01) |
| H05K 1/14 | (2006.01) |
| H04B 10/40 | (2013.01) |
| H01S 5/343 | (2006.01) |
| H01S 5/028 | (2006.01) |
| H01S 5/02 | (2006.01) |
| H01S 5/20 | (2006.01) |

(52) U.S. Cl.
CPC .......... *H01S 5/2275* (2013.01); *H01S 5/0202* (2013.01); *H01S 5/0206* (2013.01); *H01S 5/028* (2013.01); *H01S 5/0287* (2013.01); *H01S 5/0421* (2013.01); *H01S 5/2086* (2013.01); *H01S 5/34306* (2013.01); *H01S 5/34313* (2013.01); *H01S 5/34366* (2013.01); *H01S 2301/176* (2013.01); *H01S 2304/04* (2013.01); *H04B 10/40* (2013.01); *H05K 1/147* (2013.01); *H05K 1/181* (2013.01); *H05K 2201/10121* (2013.01)

(58) Field of Classification Search
CPC .. H01S 5/34366; H01S 2304/04; H01S 5/028; H01S 5/0206; H01S 5/2086; H01S 2301/176; H01S 5/22; H01S 5/0202; H01S 5/0287; H01S 5/34306; H05K 1/181; H05K 2201/10121; H05K 1/147; H04B 10/40

See application file for complete search history.

OPTICAL SEMICONDUCTOR DEVICE, OPTICAL TRANSMITTER MODULE, OPTICAL MODULE, AND OPTICAL TRANSMISSION EQUIPMENT, AND METHOD FOR MANUFACTURING THEREOF

CROSS-REFERENCE TO RELATED APPLICATION

The present application claims priority from Japanese application JP 2017-064377, filed on Mar. 29, 2017, the content of which is hereby incorporated by reference into this application.

BACKGROUND OF THE INVENTION

1. Field of the Invention

The present invention relates to an optical semiconductor device, an optical transmitter module, an optical module, and an optical transmission equipment, and a method for manufacturing thereof, and in particular, relates to an edge emitting optical semiconductor device.

2. Description of the Related Art

An edge emitting optical semiconductor device in which a semiconductor multilayer including an active layer is stacked on a semiconductor substrate is used. Generally, in order to improve the characteristics and reliability, an insulating film is formed on the end surface of the edge emitting optical semiconductor device. Here, the insulating film is, for example, an anti-reflection film or a high reflection film. Such an optical semiconductor device is fabricated in large quantities on a wafer and cleaved into a plurality of bars. In each bar, a plurality of optical semiconductor devices are arranged in a line. A spacer is sandwiched between the bars, and the sandwiching operation is performed repeatedly. By sandwiching a spacer between adjacent bars, insulating films can be collectively formed on the end surfaces of a plurality of bars by a sputtering method.

SUMMARY OF THE INVENTION

An electrode is provided on the upper surface of the optical semiconductor device, and such an electrode includes an electrode pad portion for wire bonding. If the contact between the bar and the spacer is insufficient, unnecessary gaps are generated between the bar and the spacer. Then, if the material of the insulating film formed on the end surface wraps around not only the end surface but also the upper surface of the optical semiconductor device, the material adheres to the surface of the pad portion of the electrode. In a case where the material adheres to the surface of the pad portion, the adhesion density of wire bonding is lowered in the wire bonding (W/B) process performed in a later process. This problem has been found as a result of intensive study by the inventors.

In FIG. 1 of JP2012-253205A, an n-type electrode 30 formed to spread on a substantially flat surface 10b (back surface) of a semiconductor substrate of a blue-violet semiconductor laser device 100 is disclosed. The n-type electrode 30 includes a lower surface 30b, a side surface extending from the peripheral edge of the lower surface 30b along the stacking direction, and a lower surface 30a spreading outward from the peripheral edge of the side surface, and forms a recess 35.

If the structure of the n-type electrode 30 disclosed in JP2012-253205A is applied to the electrode pad portion formed on the upper surface of the optical semiconductor device, it is necessary to process the electrode pad portion into a trench structure, and the manufacturing process becomes complicated.

The present invention has been made in view of the above problems, and an object of the present invention is to provide an optical semiconductor device, an optical transmitter module, an optical module, and an optical transmission equipment, and a method for manufacturing thereof, which make wire bonding with the outside more reliable.

(1) According to an aspect of the present invention, there is provided an optical semiconductor device including a semiconductor substrate; a first semiconductor multilayer that is stacked on a first surface side of the semiconductor substrate, has a mesa structure extending along a light emitting direction, and emits light from an exit end surface; an electrode pad portion for wire bonding which is electrically connected to the upper surface of the mesa structure of the first semiconductor multilayer, is disposed on one side of the mesa structure, and is electrically connected to outside; and an electrode pad peripheral portion including a first rising surface which is in contact with the outer edge of the electrode pad portion on the exit end surface side and rises along a stacking direction from the electrode pad portion, in which a lower surface of the electrode pad portion is higher than the upper surface of the mesa structure of the first semiconductor multilayer.

(2) In the aspect according to (1), the first semiconductor multilayer may have a recess obtained by partially removing a region including the electrode pad portion in plan view, and a resin may be disposed between the electrode pad portion and the recess.

(3) In the aspect according to (1) or (2), the electrode pad peripheral portion may further include a second rising surface which is in contact with the outer edge of the electrode pad portion on an opposite side of the exit end surface side and rises along the stacking direction from the electrode pad portion.

(4) In the aspect according to (3), the electrode pad peripheral portion may surround the entire outer edge of the electrode pad portion in plan view.

(5) In the aspect according to any one of (1) to (4), the electrode pad peripheral portion may further include a first flat surface outwardly in contact with the first rising surface.

(6) In the aspect according to (3), the electrode pad peripheral portion may further include a second flat surface outwardly in contact with the second rising surface.

(7) According to an aspect of the present invention, there is provided an optical transmitter module including the optical semiconductor device according to any one of (1) to (6).

(8) According to an aspect of the present invention, there is provided an optical module including the optical transmitter module according to (7), and an optical receiver module.

(9) According to an aspect of the present invention, there is provided an optical transmission equipment on which the optical module according to (8) is mounted.

(10) According to an aspect of the present invention, there is provided a method of manufacturing an optical semiconductor device including a semiconductor substrate; a first semiconductor multilayer that is stacked on a first surface side of the semiconductor substrate, has a mesa structure extending along a light emitting direction, and emits light from an exit end surface; an electrode pad portion for wire bonding which is electrically connected to an upper surface of the mesa structure of the first semiconductor multilayer, is disposed on one side of the mesa structure, and is electrically connected to outside; and an electrode pad peripheral portion including a first rising surface which is in contact with the outer edge of the electrode pad portion on the exit end surface side and rises along a stacking direction from the electrode pad portion, in which a lower surface of the electrode pad portion is higher than the upper surface of the mesa structure of the first semiconductor multilayer, and the method may include stacking the first semiconductor multilayer, forming a recess by removing parts including a region to be the electrode pad portion in the first semiconductor multilayer; and coating a resin on the recess with a spin coater to form a step in the resin to be coated.

The present invention provides an optical semiconductor device, an optical transmitter module, an optical module, and an optical transmission equipment, and a method for manufacturing thereof, which make wire bonding with the outside more reliable.

DETAILED DESCRIPTION OF THE INVENTION

Hereinafter, embodiments of the present invention will be specifically described in detail with reference to the drawings. In addition, in all of the drawings for describing the embodiments, the same reference numerals are given to the members having the same functions, and the repetitive description thereof will be omitted. It should be noted that the drawings shown below merely illustrate examples of the embodiments, and the sizes of the drawings and the scales described in the examples do not necessarily coincide with each other.

Figure 1:
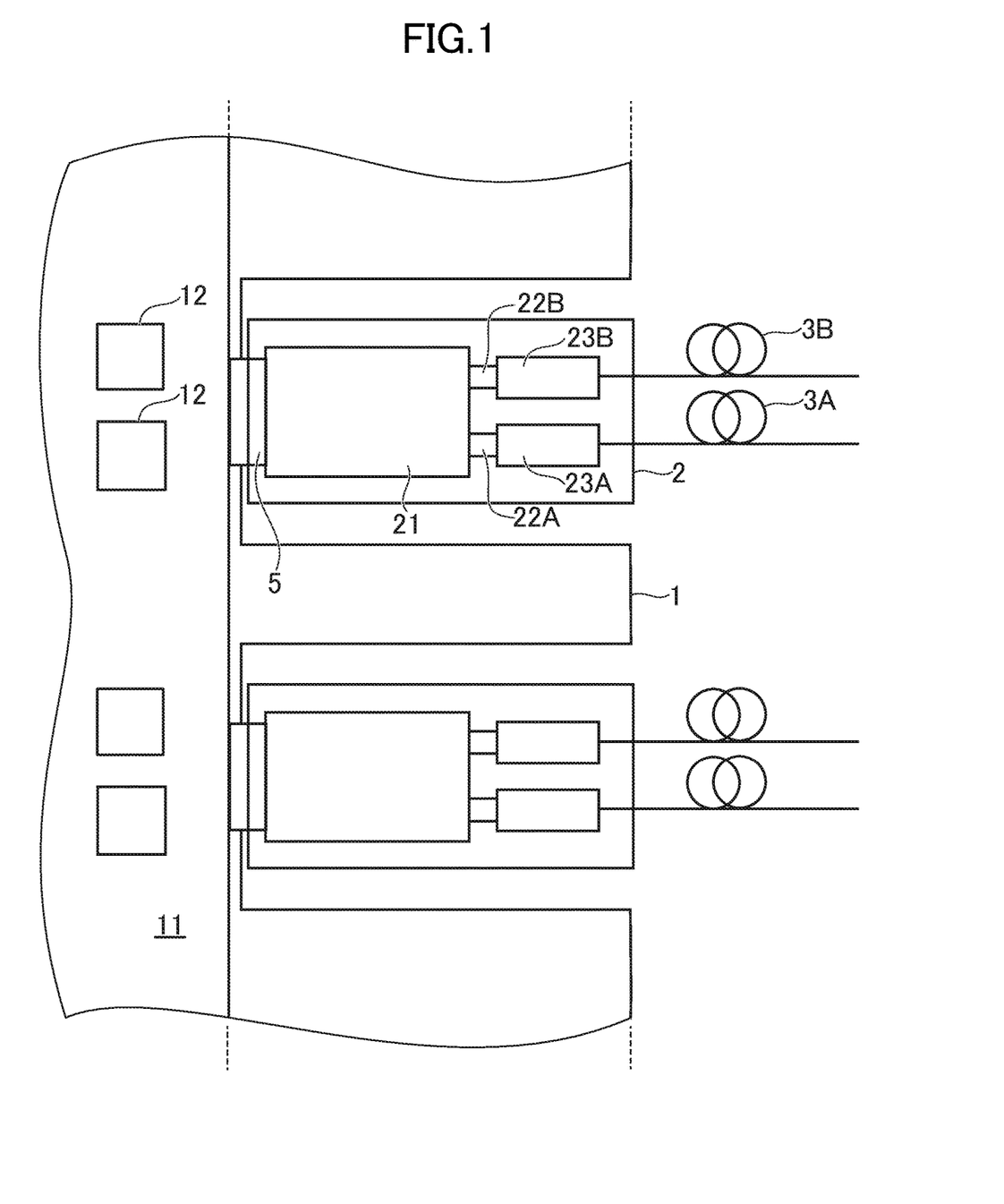
FIG. 1 is a schematic diagram illustrating configurations of an optical transmission equipment and an optical module according to an embodiment of the present invention.

FIG. 1 is a schematic diagram illustrating configurations of an optical transmission equipment 1 and an optical module 2 according to an embodiment of the present invention. The optical transmission equipment 1 includes a printed circuit board 11 and an IC 12. The optical transmission equipment 1 is, for example, a large-capacity router or switch. The optical transmission equipment 1 has, for example, a function of exchanger, and is disposed in a base station or the like. The optical transmission equipment 1 includes a plurality of optical modules 2 mounted thereon, and is configured to acquire reception data (reception electric signal) from the optical modules 2, determine a destination and a type of data to be transmitted, by using the IC 12, generate transmission data (transmission electric signal), and transmit the data to the corresponding optical module 2 through the printed circuit board 11.

The optical module 2 is a transceiver having a function of optical transmitting and a function of optical receiving. The optical module 2 includes a printed circuit board 21, an optical receiver module 23A that converts an optical signal received through an optical fiber 3A into an electric signal, and an optical transmitter module 23B that converts the electric signal into an optical signal and transmits the optical signal to an optical fiber 3B. The printed circuit board 21 is connected to the optical receiver module 23A and the optical transmitter module 23B through flexible printed circuit boards 22A, 22B, respectively. An electric signal is transmitted to the printed circuit board 21 through the flexible printed circuit board 22A from the optical receiver module 23A, and an electric signal is transmitted to the optical transmitter module 23B through the flexible printed circuit board 22B from the printed circuit board 21. The optical module 2 and the optical transmission equipment 1 are connected to each other through an electric port 5. The optical receiver module 23A (the optical transmitter module 23B) is electrically connected to the printed circuit board 21, and converts an optical signal (electric signal) into an electric signal (optical signal).

A transmission system according to the embodiment includes two or more optical transmission equipments 1, two or more optical modules 2, and one or more optical fibers 3 (for example, 3A, 3B). One or more optical modules 2 are connected to each optical transmission equipment 1. The optical fiber 3 is connected between the optical modules 2 respectively connected to the two optical transmission equipments 1. Transmission data generated by one optical transmission equipment 1 is converted into an optical signal by the connected optical module 2, and the optical signal is transmitted to the optical fiber 3. The optical signal transmitted on the optical fiber 3 is received by the optical module 2 connected to the other optical transmission equipment 1, the optical module 2 converts the optical signal into an electric signal, and transmits the electric signal to the other optical transmission equipment 1 as reception data.

Figure 2A:
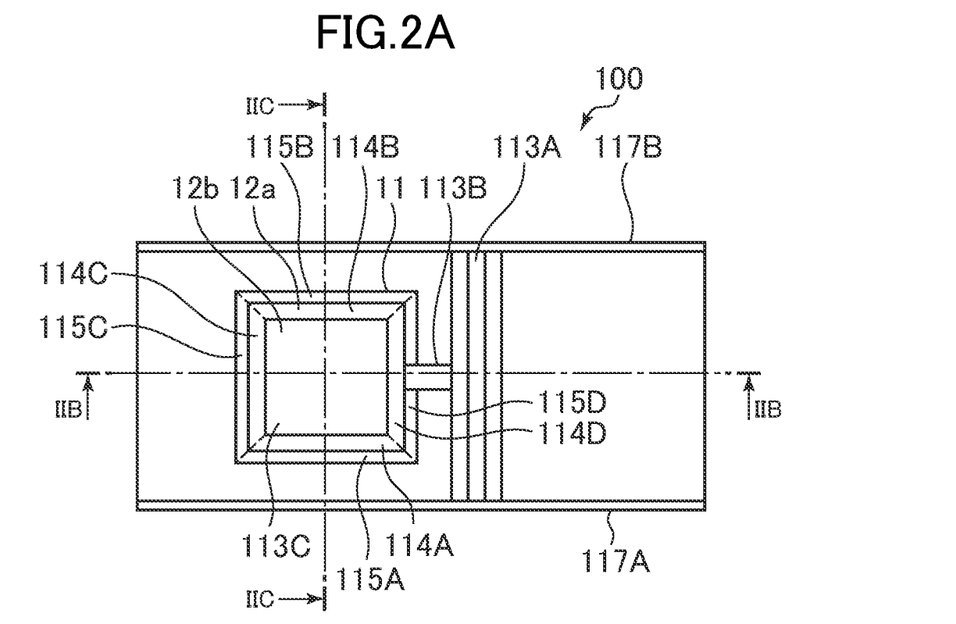
FIG. 2A is a plan view of a semiconductor laser device according to the embodiment of the present invention.
Figure 2B:
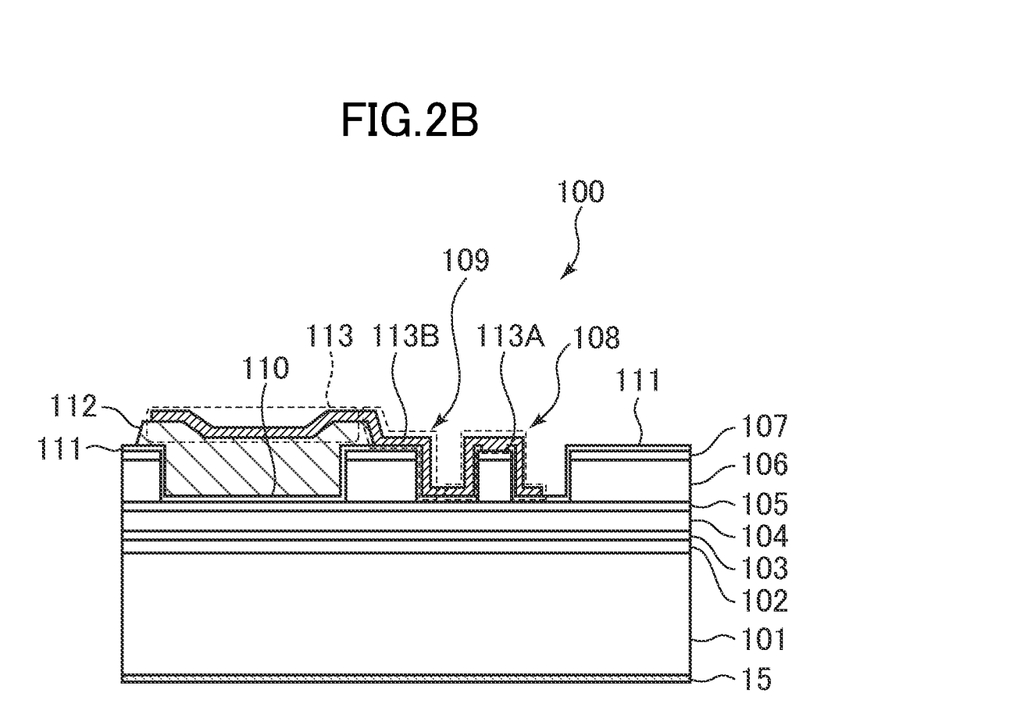
FIG. 2B is a cross-sectional view of the semiconductor laser device according to the embodiment of the present invention.
Figure 2C:
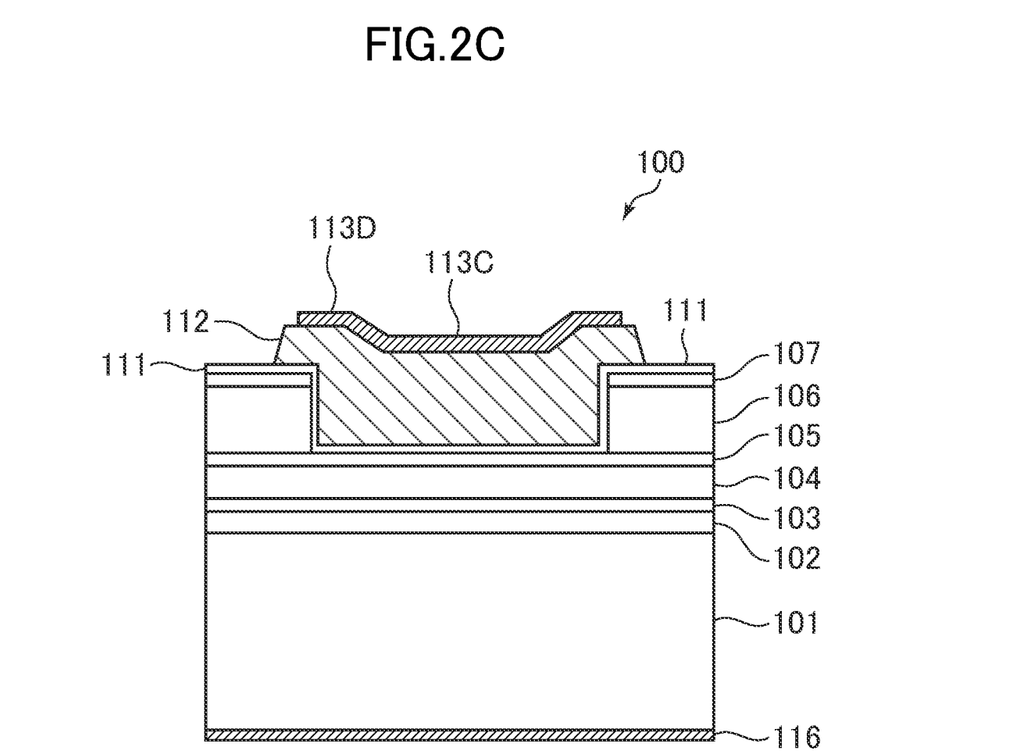
FIG. 2C is a cross-sectional view of the semiconductor laser device according to the embodiment of the present invention.

FIG. 2A is a plan view of a semiconductor laser device 100 according to the embodiment. FIG. 2B and FIG. 2C are cross-sectional views of the semiconductor laser device 100 according to the embodiment. FIG. 2B is a cross-sectional view taken along a line IIB-IIB of FIG. 2A, and FIG. 2C is a cross-sectional view taken along a line IIC-IIC of FIG. 2A. The optical transmitter module 23B is provided with one or a plurality of optical semiconductor devices. Here, each of the one or the plurality of optical semiconductor devices is the semiconductor laser device 100 according to the embodiment. The semiconductor laser device 100 according to the embodiment is a direct modulation type semiconductor laser device of a 1.3 μm band ridge waveguide type used for optical communication.

The semiconductor laser device 100 according to the embodiment includes a semiconductor substrate, a first semiconductor layer, a resin layer, and a p-side electrode 113. Here, the semiconductor substrate is an n-type InP substrate 101, and the upper surface of the n-type InP substrate 101 (the upper surface shown in FIGS. 2B and 2C) is defined as a first surface, and the lower surface (the lower surface shown in FIGS. 2B and 2C) is defined as a second surface, respectively. On the first surface side of the n-type InP substrate 101, a first semiconductor multilayer (compound semiconductor layer) including an n-type buffer layer 102 (n-type InP layer), an n-type optical guide layer 103 (n-type InGaAlAs layer), an active layer 104, a p-type optical guide layer 105 (p-type InGaAlAs layer), a p-type cladding layer 106 (p-type InP layer), and a p$^+$-type contact layer 107 (p$^+$-type InGaAs layer) is stacked. Here, the active layer 104 has a strained multiple quantum well structure in which an InGaAlAs well layer and an InGaAlAs barrier layer are alternately stacked. Each of the materials of the n-type optical guide layer 103, the active layer 104, and the p-type optical guide layer 105 is an InGaAlAs-based material, but the present invention is not limited thereto, and other semiconductor compounds may be used. For example, an InGaAsP-based material may be used. Further, the n-type buffer layer 102, the n-type optical guide layer 103, and the p-type optical guide layer 105 may be provided if necessary, and they may not be provided. The first semiconductor layer may further include a grating. For example, the p-type optical guide layer 105 may serve as a grating layer, or a grating layer may be provided as a new layer between the p-type optical guide layer 105 and the p-type cladding layer 106.

In the semiconductor laser device 100 according to the embodiment, a ridge structure 108 extending (linearly extending) from the rear end surface to the exit end surface (front end surface) along the light emitting direction is formed, by removing the p-type cladding layer 106 and pt-type contact layer 107 of the first semiconductor multilayer by etching. That is, the p-type cladding layer 106 and pt-type contact layer 107 on both sides of the ridge structure 108 are removed. The semiconductor laser device 100 is an edge emitting semiconductor laser device which emits light from the exit end surface, and the light is emitted from the first semiconductor multilayer.

Further, on one side (on the left side of FIG. 2B) of the ridge structure 108, a bank portion 109 is formed in which the p-type cladding layer 106 and pt-type contact layer 107 of the first semiconductor multilayer is not removed. Further, on the one side, a recess 110 is formed in which the p-type cladding layer 106 and pt-type contact layer 107 of the first semiconductor multilayer is removed by etching. A passivation film 111 is disposed in a predetermined shape covering the upper surface of the first semiconductor multilayer. Here, the predetermined shape is a shape excluding at least a part of the upper surface (the p-type cladding layer 106 which is the uppermost layer) of the ridge structure 108.

The resin layer has an insulating property with a lower dielectric constant than the first semiconductor multilayer (semiconductor crystal) and here, it is a polyimide resin layer 112. However, the material of the resin layer is not limited to polyimide resin, and another resin may be used as long as it has an insulating property with a lower dielectric constant than the first semiconductor multilayer. For example, it may be benzocyclobutene (BCB). It is desirable to use a material having a high resistance to dry etching such as ion milling and having low hygroscopicity, as the material of the resin layer. The polyimide resin layer 112 is disposed between the electrode pad portion 113C and the recess 110, and is disposed so as to spread outside the edge of the recess 110. Generally, the resin layer has a viscosity. Therefore, the upper surface (the upper surface shown in FIGS. 2B and 2C) of the polyimide resin layer 112 disposed so as to bury the recess 110 has a lower height on the inner side than the edge (outside of the edge) of the recess 110 (recessed).

The p-side electrode 113 includes an electrode ridge portion 113A, an electrode connection portion 113B, an electrode pad portion 113C, and an electrode pad peripheral portion 113D. The electrode ridge portion 113A is a portion which is physically in contact with the upper surface of the ridge structure 108 of the first semiconductor multilayer and spreads on both sides of the ridge structure 108. The electrode pad portion 113C is disposed on the upper surface of the polyimide resin layer 112 and one side of the ridge structure 108, and is provided for wire bonding which is electrically connected to outside. With respect to the electrode pad portion 113C, it is desirable that the upper surface is substantially a flat surface for wire bonding. Here, the outer edge of the electrode pad portion 113C has a rectangular shape (in particular, a square shape). However, the present invention is not limited thereto, and the electrode pad portion 113C may have another shape such as a circular shape.

The electrode pad peripheral portion 113D covers the entire outer edge of the electrode pad portion 113C and is in contact with the outer edge in plan view, and includes a rising surface 114 that rises along the stacking direction (upward in FIG. 2B and FIG. 2C) from the electrode pad portion 113C. The rising surface 114 is oblique to the stacking direction. Further, the electrode pad peripheral portion 113D has a flat surface 115 that spreads outward from the outer edge of the rising surface 114 in plan view. Here, the flat surface 115 has a frame shape (a hollow rectangular shape). Further, here, the outer edge of the electrode pad peripheral portion 113D has a rectangular shape (in particular, a square shape). The flat surface 115 (upper surface) of the electrode pad peripheral portion 113D is higher than the upper surface of the electrode pad portion 113C. Since the electrode pad portion 113C has a rectangular shape, the rising surface 114 has a first rising surface 114A in contact with the outer edge (lower side shown in FIG. 2A) on the exit end surface side of the electrode pad portion 113C, a second rising surface 114B in contact with the outer edge (upper side shown in FIG. 2A) on the opposite side of the exit end surface side of the electrode pad portion 113C, a third rising surface 114C in contact with the outer edge (left side shown in FIG. 2A) on the opposite side of the ridge structure 108 side of the electrode pad portion 113C, and a fourth rising surface 114D in contact with the outer edge (right side shown in FIG. 2A) on the ridge structure 108 side of the electrode pad portion 113C. Then, the flat surface 115 includes a first flat surface 115A that comes into contact with the first rising surface 114A and spreads outward (downward in FIG. 2A), a second flat surface 115B that comes into contact with the second rising surface 114B and spreads outward (upward in FIG. 2A), a third flat surface 115C that comes into contact with the third rising surface 114C and spreads outward (leftward in FIG. 2A), and a fourth flat surface 115D that comes into contact with the fourth rising surface 114D and spreads outward (rightward in FIG. 2A). It is desirable that the outer edge of the electrode pad portion 113C is located inside the recess 110 in plan view. Further, it is desirable that the outer edge of the electrode pad peripheral portion 113D is located outside the recess 110.

Here, the outer edge of the electrode pad portion 113C and the outer edge of the electrode pad peripheral portion 113D both have a rectangular shape. It is desirable that the first width of the electrode pad portion 113C (the width in the vertical direction shown in FIG. 2A) is not less than 70% and not more than 90% of the width of the electrode pad peripheral portion 113D in the same direction. Similarly, it is desirable that the second width of the electrode pad portion 113C (the width in the horizontal direction shown in FIG. 2A) is not less than 70% and not more than 90% of the width of the electrode pad peripheral portion 113D in the same direction.

The electrode connection portion 113B is an electrode lead wire disposed to electrically connect the electrode ridge portion 113A and the electrode pad peripheral portion 113D. The electrode ridge portion 113A is electrically connected to the electrode pad portion 113C through the electrode connection portion 113B and the electrode pad peripheral portion 113D. Here, the electrode 113 is a multilayer film made of Ti/Pt/Au (Ti, Pt and Au are stacked in this order). Since the respective portions (to be described later) of the electrode 113 are formed in the same process, the thickness of each portion is substantially the same (excluding the rising surface 114, the side surface of the ridge structure 108, and the side surface of the bank portion 109, which are disposed obliquely). Therefore, the shape of the electrode 113 (particularly, in the stacking direction) depends on the shapes of the upper surface of the first semiconductor multilayer and the upper surface of the polyimide resin layer 112. In particular, the shapes of the rising surface 114 and the flat surface 115 of the electrode pad peripheral portion 113D depend on the shape of the upper surface of the polyimide resin layer 112. It is noted that the size of the step of the recess 110 (the difference between the heights of the lower edge and the upper edge of the rising surface 114) and the coating film thickness (resin layer thickness) are in a trade-off relationship, depending on the viscosity of the material of the resin layer.

An n-side electrode 116 is disposed on the second surface of the n-type InP substrate 101. Further, an exit end surface coating film 117A which is an antireflection film is disposed on the exit end surface of the semiconductor laser device 100, and a rear facet coating film 117B which is a high reflection film is disposed on the rear end surface which is the end surface opposite to the exit end surface.

A first feature of the optical semiconductor device according to the embodiment is that the resin layer is disposed below the electrode pad portion 113C so that the lower surface of the electrode pad portion 113C is higher than the upper surface of the ridge structure 108 of the first semiconductor multilayer. It is more desirable that the upper surface of the electrode pad portion 113C is higher than the upper surface of the electrode ridge portion 113A. In the embodiment, the case where the optical semiconductor device has a ridge structure is described, but the present invention is not limited thereto. For example, the present invention can be applied to the case where the optical semiconductor device has a buried hetero (BH) structure or a high mesa structure (a structure having an active layer in the structure). In the case of the BH structure and the high mesa as well, it has the first feature. That is, the first feature is that the lower surface of the electrode pad portion 113C is higher than the upper surface of the mesa portion (including the ridge structure).

The second feature is that the electrode pad peripheral portion 113D has the first rising surface 114A. According to the first and second features, when a spacer is sandwiched between adjacent bars and an insulating film is formed on the exit end surface of the optical semiconductor device in the process of manufacturing the optical semiconductor device according to the embodiment, it is possible to prevent the material (such as Si, $SiO_2$, SiN, $Al_2O_3$, and $TaO_x$) of the insulating film to be formed on the exit end surface from wrapping around and adhering not only to the exit end surface but also to the electrode pad portion 113C. That is, in the case where the material of the insulating film wraps around (enters) not only the exit end surface but also the electrode pad portion side, the first rising surface 114A and the first flat surface 115A play a role as breakwaters, and it is possible to prevent the material of the insulating film from adhering to the electrode pad portion 113C.

The third feature is that the electrode pad peripheral portion 113D has the second rising surface 114B. According to the first and third features, when a spacer is sandwiched between adjacent bars and an insulating film is formed on the rear end surface of the optical semiconductor device in the process of manufacturing the optical semiconductor device according to the embodiment, it is possible to prevent the material of the insulating film to be formed on the rear end surface from wrapping around and adhering not only to the rear end surface but also to the electrode pad portion 113C. Similarly, in the case of the above-described exit end surface, the second rising surface 114B and the second flat surface 115B play a role as breakwaters, so that it is possible to prevent the insulating film material from adhering to the electrode pad portion 113C. The height of each part disposed on the first surface side of the semiconductor substrate is determined based on the first surface (or second surface) of the semiconductor substrate.

Since the electrode pad portion 113C is located lower than the electrode pad peripheral portion 113D, even in the case where a film-like adhesive sheet temporarily used in the manufacturing process is adhered to the upper surface of the n-type InP substrate 101, it is possible to prevent the adhesive sheet from being in contact with the electrode pad portion 113C and maintain the area for wire bonding of the electrode pad portion 113C in a clean state.

A fourth feature according to the embodiment is that the first semiconductor multilayer has the recess 110 obtained by partially removing a region including the electrode pad portion 113C in plan view, and a resin is disposed between the electrode pad portion 113C and the recess 110. In order to improve the operation speed of the optical semiconductor device for optical communication, it is important to reduce the parasitic capacitance associated with the optical semiconductor device. JP2011-09456A discloses a structure in which the substrate crystal under the electrode pad is removed by etching so that a thick resin layer having a low dielectric constant is formed to reduce the parasitic capacitance. Since the optical semiconductor device according to the embodiment has the fourth feature, the parasitic capacitance due to the electrode pad portion 113C can be further reduced. Since the electrode pad portion 113C is disposed on the polyimide resin layer 112, the electrode pad peripheral portion 113D is located at a position higher than the electrode ridge portion 113A of the p-side electrode 113. Therefore, it is possible to prevent mesa chipping when adsorbed by a nozzle or the like.

Note that the electrode pad peripheral portion 113D according to the embodiment is disposed so as to surround the outer edge of the electrode pad portion 113C, but the electrode pad peripheral portion 113D may not include the third rising surface 114C. Similarly, the electrode pad peripheral portion 113D may not include the fourth rising surface 114D.

The semiconductor laser device 100 according to the embodiment has been described above. Hereinafter, a method for manufacturing the semiconductor laser device 100 according to the embodiment will be described.

FIGS. 3A to 3F are cross-sectional views illustrating processes of manufacturing the semiconductor laser device 100 according to the embodiment. The cross sections shown in FIGS. 3A to 3F correspond to the cross section shown in FIG. 2B.

Figure 3A:
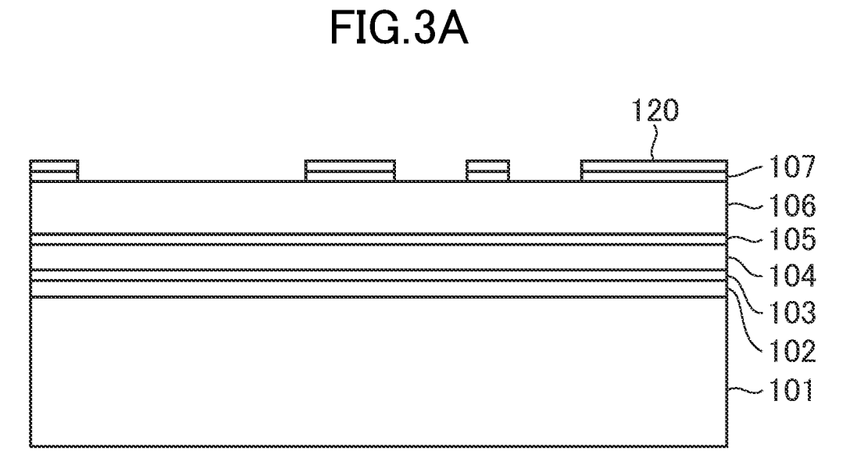
FIG. 3A is a cross-sectional view illustrating a process of manufacturing the semiconductor laser device according to the embodiment of the present invention.

A first semiconductor multilayer including the n-type buffer layer 102, the n-type optical guide layer 103, the active layer 104, the p-type optical guide layer 105, the p-type cladding layer 106, and the pt-type contact layer 107 is stacked on a wafer of n-type InP (to be an n-type InP substrate 101 later) by using a MOCVD method (first semiconductor multilayer stacking process).

Figure 3B:
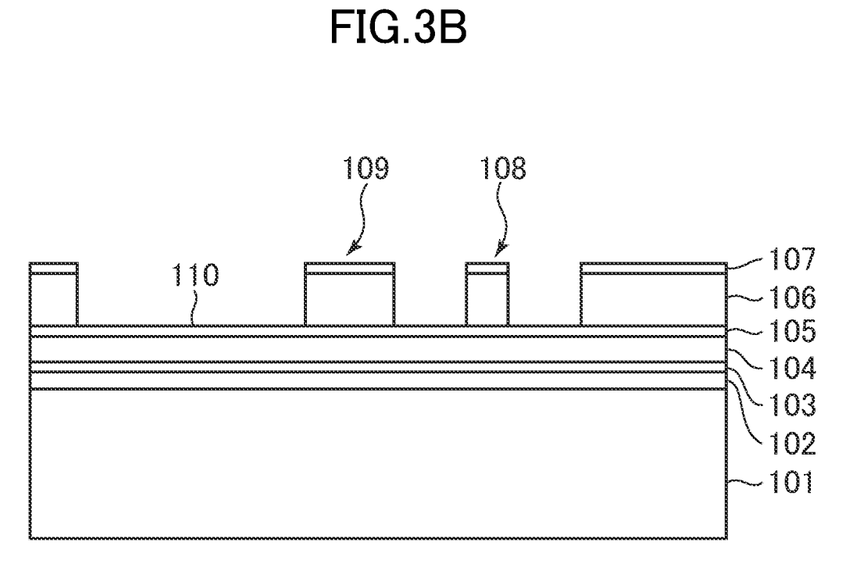
FIG. 3B is a cross-sectional view illustrating a process of manufacturing the semiconductor laser device according to the embodiment of the present invention.

An oxide film 120 including the region to be the ridge structure 108 and the region to be the bank portion 109 on the upper surface of the first semiconductor multilayer is formed by a chemical vapor deposition (CVD) method. The oxide film 120 is patterned by a photolithography technique. Using the patterned oxide film 120 as an etching mask, first, the p+-type contact layer 107 is removed by etching (see FIG. 3A). The width of the pt-type contact layer 107 where the ridge structure 108 is formed is, for example, 2.0 μm. The width of the opening on both sides of the position to form the ridge structure 108 (the gap between the ridge structure 108 and the bank portion 109 on one side) is, for example, 12 μm. The width of the opening of the region where the recess 110 is formed is, for example, 120 μm, and the region where the recess 110 is formed is square. Subsequently, the p-type cladding layer 106 is removed by etching, by using wet etching with a mixture of hydrochloric acid and phosphoric acid (ridge structure and recess forming process: FIG. 3B). Here, the recess 110 is formed by removing parts including a region to be the electrode pad portion 113C in the first semiconductor multilayer. Through this process, the ridge structure 108 and the recess 110 are formed in the first semiconductor multilayer. In the step of removing the p-type cladding layer 106, the p-type optical guide layer 105 functions as an etching stop layer.

Figure 3C:
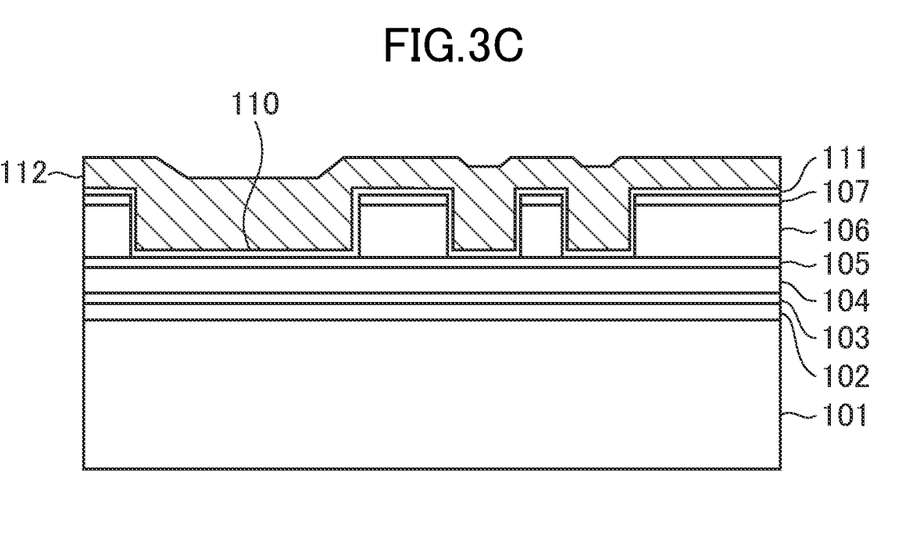
FIG. 3C is a cross-sectional view illustrating a process of manufacturing the semiconductor laser device according to the embodiment of the present invention.

For example, the passivation film 111 having a thickness of 0.5 μm is formed on the entire upper surface of the semiconductor laser device 100 by the CVD method. That is, the passivation film 111 is also formed in the ridge structure 108 and the recess 110. Thereafter, the polyimide resin layer 112 is coated on the entire upper surface of the semiconductor laser device 100 by a spin coater (resin layer forming process: FIG. 3C). At this time, the width (120 μm) of the opening, which is the region where the recess 110 is formed, is sufficiently wider than the depth (about 1.5 μm) of the recess 110. Furthermore, when the viscosity of the polyimide resin layer 112 is appropriate (not too high), the polyimide resin layer 112 temporarily keeps a constant thickness from the substrate surface and forms a step according to the unevenness of the substrate surface. In order to volatilize the solvent contained in the polyimide resin, the polyimide resin layer 112 is cured by heating the wafer to 350° C. immediately after coating the polyimide resin. At this time, the polyimide resin layer 112 is cured while maintaining a certain degree of unevenness, due to the viscosity of the polyimide resin layer 112, so that a step is formed in the polyimide resin layer 112 embedded in the recess 110 (resin layer coating process: see FIG. 3C).

In the coating of the polyimide resin layer 112, the thickness of the coating film depends on the viscosity and the rotation number of the spin coater. However, when the viscosity is low and the rotation number of the spin coater is increased, in the polyimide resin layer 112, the shape like the recess 110 is reproduced more and a step becomes large, but the film thickness becomes thin, so that the effect of reducing the parasitic capacitance becomes small. On the other hand, when the viscosity is large and the rotation number of the spin coater is decreased, the thickness of the coating film can be increased, but the surface after the spin coating is close to flat. Depending on the material selected for the resin layer, the step shape of the recess 110 remains on the surface of the polyimide resin layer 112, and operation conditions such as an appropriate viscosity and a rotation number of the spin coater may be selected in which a thickness ensuring necessary frequency response characteristics can be realized.

Furthermore, even after completion of the spin coating, unevenness of the polyimide resin layer 112 disappears and it becomes flat after a certain period of time. Therefore, it is desirable to perform heating and curing rapidly after completion of spin coating. Note that the operation condition of spin coating and the leaving time until heating are different depending on the characteristics such as the viscosity of the material selected for the resin layer, so that optimal conditions may be found as appropriate.

Figure 3D:
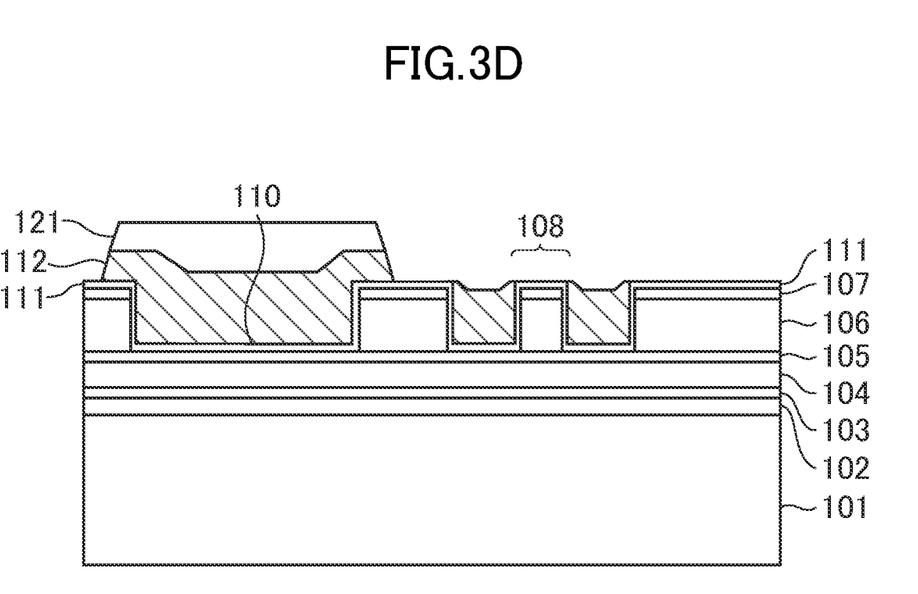
FIG. 3D is a cross-sectional view illustrating a process of manufacturing the semiconductor laser device according to the embodiment of the present invention.
Figure 3E:
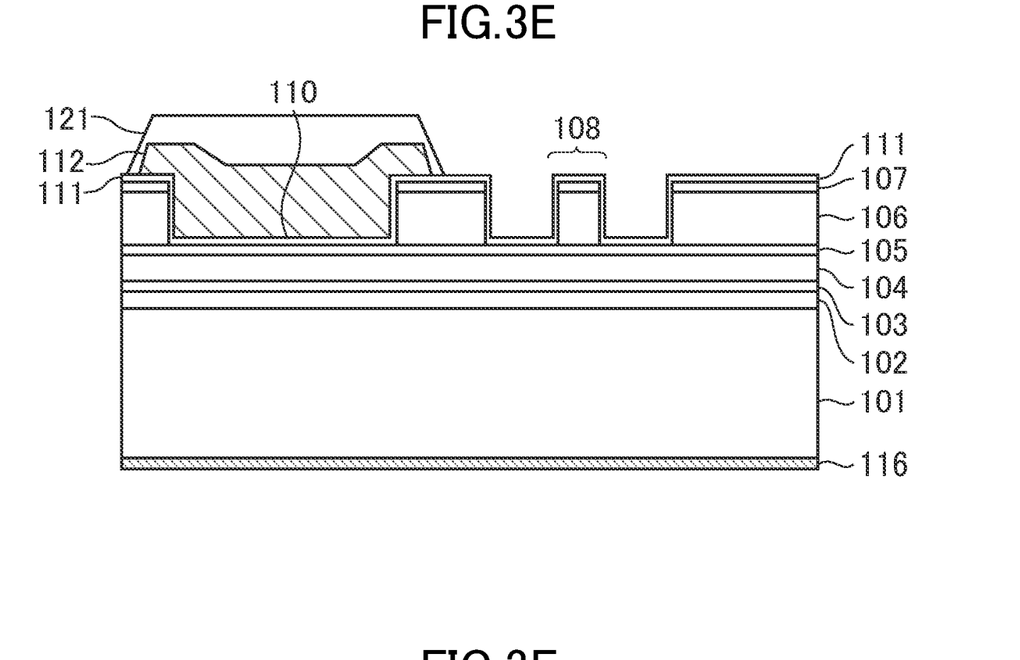
FIG. 3E is a cross-sectional view illustrating a process of manufacturing the semiconductor laser device according to the embodiment of the present invention.

Next, a resist mask 121 covering a region to be the recess 110 is formed, and the polyimide resin layer 112 is removed by dry etching (etch back: refer to FIG. 3D). The etch back is performed until the upper surface of the ridge structure 108 appears. Next, the resist mask 121 is removed, a new resist mask 122 is formed so as to cover the polyimide resin layer 112 formed on the upper portion of the recess 110, and the polyimide resin layer 112 at both ends of the ridge structure 108 is removed by dry etching (resin layer forming process: see FIG. 3E). Thereafter, the resist mask 122 is removed. Further, the passivation film 111 on the upper surface of the ridge structure 108 is removed, and a through-hole to the pt-type contact layer 107 on the upper surface of the ridge structure 108 (see FIG. 3E) is formed.

Figure 3F:
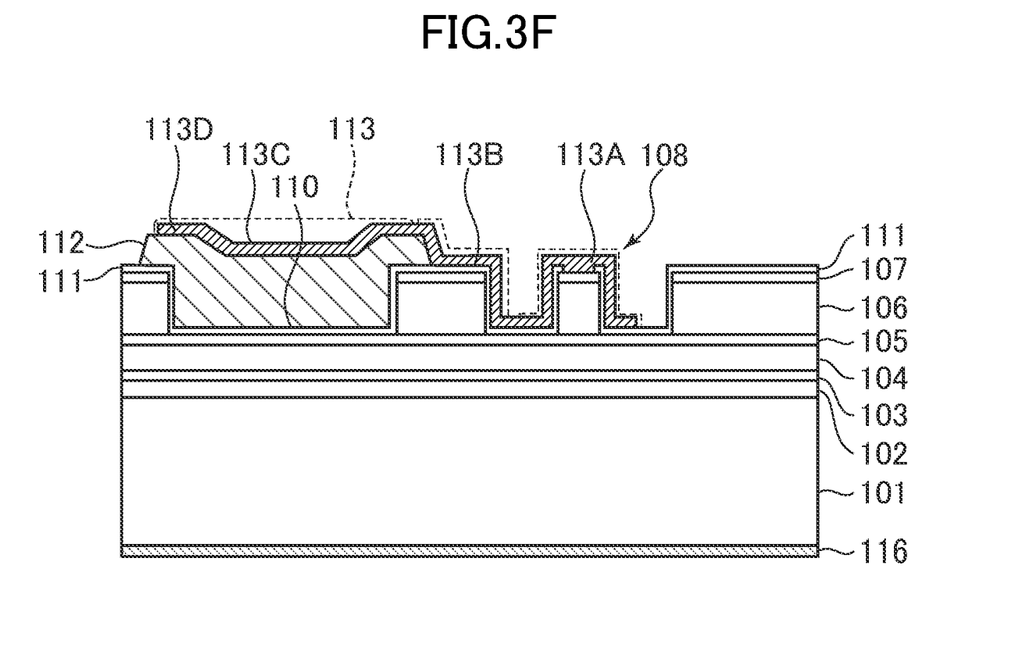
FIG. 3F is a cross-sectional view illustrating a process of manufacturing the semiconductor laser device according to the embodiment of the present invention.

Further, a multilayer film (electrode layer) made of Ti/Pt/Au and having a thickness of about 1 μm is formed by an electron beam (EB) vapor deposition method. The multilayer film is patterned by an ion milling method to form a p-side electrode 113. At this time, as shown in FIG. 3F, the electrode pad portion 113C is formed so as to cover the edge of the recess 110. On the second surface of the n-type InP wafer, after polishing, an n-type electrode 116 is formed (electrode formation process: see FIG. 3F). Here, the wafer process is completed.

Figure 4A:
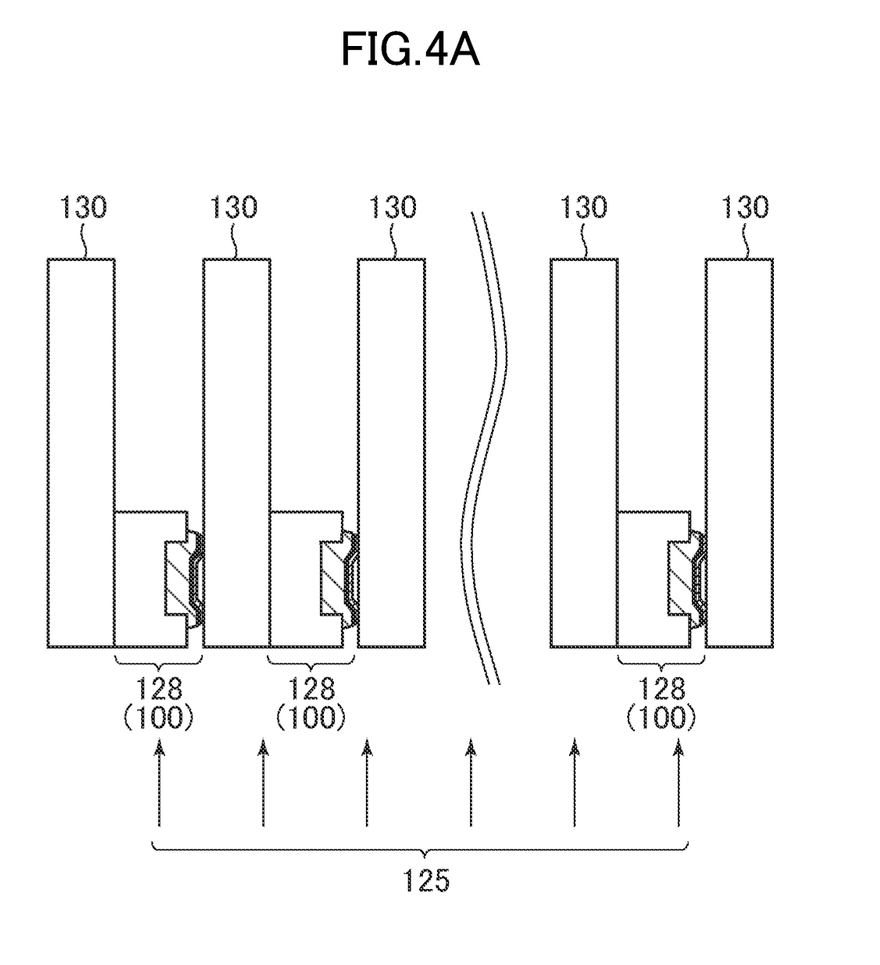
FIG. 4A is a view illustrating a process of forming an insulating film according to the embodiment of the present invention.

FIG. 4A is a view illustrating a process of forming an insulating film (end surface coating film) according to the embodiment. The wafer is cleaved in a direction perpendicular to the ridge structure 108 to form a plurality of bars. Here, the width of a bar 128 is set to a predetermined desired cavity length, for example, 150 μm. An insulating film (an anti-reflection film or a high reflection film) is formed on the cleaved end surface of the bar 128 by a sputtering method. At each bar 128, a plurality of semiconductor laser devices 100 are arranged in a line. As shown in FIG. 4A, insulating films are collectively formed on the end surfaces of a plurality of bars by sandwiching a spacer 130 between adjacent bars 128, and irradiating an insulating film material 125 by a sputtering method (end surface insulating film formation process). Here, the insulating film formed on the exit end surface is the exit end surface coating film 117A, and the insulating film formed on the rear end surface is the rear facet coating film 117B.

Figure 4B:
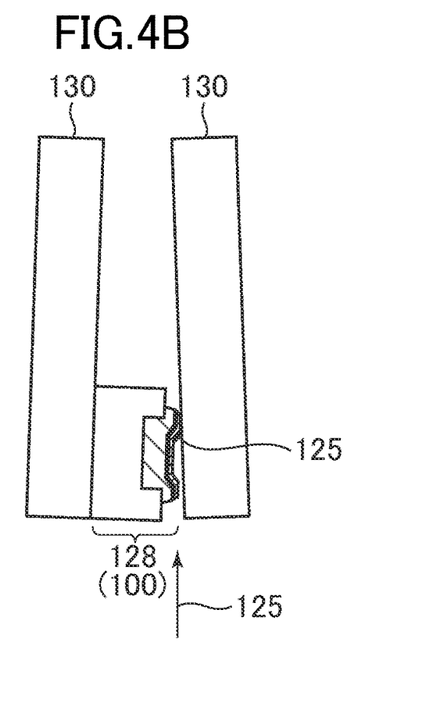
FIG. 4B is a view illustrating an example of a process of forming an insulating film according to the embodiment of the present invention.

FIG. 4B is a view illustrating an example of a process of forming an insulating film according to the embodiment. Here, FIG. 4B illustrates a process of forming the exit end surface coating film 117A to be formed on the exit end surface. As described above, the spacer 130 is sandwiched between adjacent bars 128. FIG. 4B shows a case where a positional deviation occurs in the bar 128 supported by the adjacent spacers 130. As shown in FIG. 4B, even if the adjacent spacers 130 are not positioned in parallel and do not support the bar 128 and a space is generated between the bar 128 and the spacer 130, the electrode pad peripheral portion 113D has the first rising surface 114A, and thus it is possible to suppress the insulating film material 125 from wrapping around and adhering not only to the exit end surface but also to the electrode pad portion 113C. In this case, the insulating film material 125 is blocked from adhering to the surface of the electrode pad portion 113C by the first rising surface 114A (and the first flat surface 115A). Then, the insulating film material 125 entering through the gap between the electrode portion and the spacer 130 adheres to the second rising surface 114B and hardly adheres to the electrode pad portion 113C. This also applies to the rear end surface. By preventing the insulating film material from wrapping around the electrode pad portion 113C, a good adhesion strength can be obtained without lowering the bonding density of wire bonding in the wire bonding process.

Figure 4C:
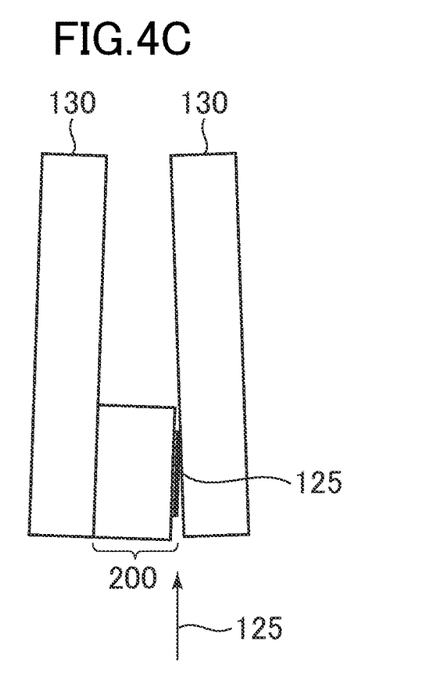
FIG. 4C is a view illustrating an example of a process of forming an insulating film according to a comparative example of the embodiment of the present invention.

FIG. 4C is a view illustrating an example of a process of forming an insulating film according to a comparative example of the embodiment. A semiconductor laser device 200 according to the comparative example is different from the embodiment in that the electrode pad portion is disposed on the bank portion disposed on the side of the ridge structure. In such a case, as shown in FIG. 4C, in a case where a space is generated between the bar 128 and the spacer 130, the insulating film material 125 wraps around and adheres not only to the exit end surface but also to the electrode pad portion 113C.

Thereafter, the bar is cleaved into each semiconductor laser device 100 (chip) to fabricate a semiconductor laser device 100. Further, the semiconductor laser device 100 according to the embodiment is mounted on the optical transmitter module 23B. In this case, the electrode pad portion 113C of the p-side electrode 113 is connected to a wire (not illustrated) by wire bonding, and is connected to a drive integrated circuit (IC: not shown) mounted on the optical transmitter module 23B. The method for manufacturing the semiconductor laser device 100 according to the embodiment has been described above.

The optical semiconductor device, the optical transmitter module, and the optical module according to the embodiment of the present invention, and the control method thereof have been described above. The bit rate of the electric signal transmitted and received by the optical module 2 according to the present invention is, for example, 100 Gbit/s. The optical transmitter module 23B may be a coarse wavelength division multiplexing (CWDM) method in which light of 25 Gbit/s is multiplexed at four wavelengths with a wavelength spacing of 20 nm and is transmitted at 100 Gbit/s. Although the optical semiconductor device according to the above embodiment is a direct modulation type semiconductor laser device of a 1.3 µm band ridge waveguide type, the present invention is not limited thereto, and it is possible to use an EA/DFB laser, a CW light source, a waveguide type photo diode (PD) element, and a Mach-Zehnder type modulator. Further, these waveguide structures may be combined with the above-mentioned modulator, semiconductor laser device, PD device, and the like. The present invention can be widely applied to an optical semiconductor device having the effect of the present invention.

While there have been described what are at present considered to be certain embodiments of the invention, it will be understood that various modifications may be made thereto, and it is intended that the appended.

What is claimed is:

1. An optical semiconductor device comprising:
a semiconductor substrate;
a semiconductor multilayer stacked on an upper surface side of the semiconductor substrate,
the semiconductor multilayer having a mesa structure extending along a light emitting direction, and
the semiconductor multilayer being configured to emit light from an exit end surface;
an electrode pad portion for wire bonding,
the electrode pad portion being:
electrically connected to an upper surface of the mesa structure,
disposed on one side of the mesa structure, and electrically connected to outside, and
a lower surface of the electrode pad portion being higher than the upper surface of the mesa structure; and
an electrode pad peripheral portion including a first rising surface and a second rising surface,
the first rising surface being in contact with an outer edge of the electrode pad portion on the exit end surface and rising along a stacking direction from the electrode pad portion, and
the second rising surface being in contact with the outer edge of the electrode pad portion on an opposite side of the exit end surface and rising along the stacking direction from the electrode pad portion.

2. The optical semiconductor device according to claim 1, wherein the electrode pad peripheral portion surrounds the outer edge of the electrode pad portion in plan view.

3. The optical semiconductor device according to claim 1, wherein the electrode pad peripheral portion further includes a flat surface outwardly in contact with the first rising surface.

4. The optical semiconductor device according to claim 3, wherein the flat surface is a first flat surface; and
wherein the electrode pad peripheral portion further includes a second flat surface outwardly in contact with the second rising surface.

5. An optical transmitter module comprising:
the optical semiconductor device of claim 1.

6. An optical module comprising:
the optical transmitter module of claim 5; and
an optical receiver module.

7. An optical transmission equipment on which the optical module of claim 6 is mounted.

8. A method for manufacturing an optical semiconductor device, the method comprising:
stacking a semiconductor multilayer on a semiconductor substrate;

forming a recess by removing a portion of the semiconductor multilayer including a region to be an electrode pad portion;

coating a resin on the recess with a spin coater to form a step in the resin;

forming an electrode pad portion on the resin; and forming an electrode pad peripheral portion on the resin, the electrode pad peripheral portion including:

a first rising surface in contact with an outer edge of the electrode pad portion on a first surface side and rising along a stacking direction from the electrode pad portion, and a second rising surface being in contact with the outer edge of the electrode pad portion on a second surface side, opposite the first surface side, and rising along the stacking direction from the electrode pad portion.

9. The method according to claim 8, wherein removing the portion of the semiconductor multilayer including the region to be the electrode pad portion comprises:

performing wet etching to remove the portion of the semiconductor multilayer including the region to be the electrode pad portion.

10. The method according to claim 8, further comprising:

forming a passivation film on the optical semiconductor device based on forming the recess; and wherein coating the resin on the recess comprises:

coating the resin on the passivation film after forming the passivation film on the optical semiconductor device.

11. The method according to claim 10, further comprising:

forming, after coating the resin on the passivation film, a resist mask covering the region to be the electrode pad portion.

12. The method according to claim 11, further comprising:

etching, after forming the resist mask, the resin to remove the resin from another region of the optical semiconductor device.

13. The method according to claim 12, further comprising:

removing the resist mask based on etching the resin; and wherein forming the electrode pad portion comprises:

forming the electrode pad portion after removing the resist mask.

14. The method according to claim 8, wherein forming the electrode pad peripheral portion comprises:

forming the electrode pad peripheral portion to surround the outer edge of the electrode pad portion in plan view.

15. The method according to claim 8, wherein the electrode pad peripheral portion further includes a flat surface outwardly in contact with the first rising surface.

16. The method according to claim 15, wherein the flat surface is a first flat surface; and wherein the electrode pad peripheral portion further includes a second flat surface outwardly in contact with the second rising surface.

17. The method according to claim 8, further comprising:

forming a ridge structure by removing other portions of semiconductor multilayer.

18. The method according to claim 17, further comprising:

forming a passivation film on the optical semiconductor device after forming the recess and the ridge structure; and wherein coating the resin on the recess comprises:

coating the resin on the passivation film after forming the passivation film on the optical semiconductor device.

19. The method according to claim 18, further comprising:

forming, after coating the resin on the passivation film, a first resist mask covering the region to be the electrode pad portion;

etching, after forming the first resist mask, the resin until an upper surface of the ridge structure appears;

removing, after etching the resin, the first resist mask;

forming, after removing the first resist mask, a second resist mask;

removing, after forming the second resist mask, the resin from both sides of the ridge structure;

removing, after removing the resin from both sides of the ridge structure, the second resist mask; and removing a portion of the passivation film from the upper surface of the ridge structure; and wherein forming the electrode pad portion comprises:

forming the electrode pad portion after removing the portion of the passivation film from the upper surface of the ridge structure.

20. An optical semiconductor device, comprising:

a semiconductor substrate;

a semiconductor multilayer stacked on an upper surface side of the semiconductor substrate, wherein the semiconductor multilayer has a mesa structure extending along a light emitting direction, and wherein the semiconductor multilayer is configured to emit light from an exit end surface;

an electrode pad portion for wire bonding, wherein the electrode pad portion is:

electrically connected to an upper surface of the mesa structure, disposed on one side of the mesa structure, and electrically connected to outside, wherein a lower surface of the electrode pad portion is higher than the upper surface of the mesa structure, wherein the semiconductor multilayer has a recess obtained by partially removing a region of the semiconductor multilayer associated with the electrode pad portion, and wherein a resin is disposed between the electrode pad portion and the recess; and an electrode pad peripheral portion including a rising surface, wherein the rising surface is in contact with an outer edge of the electrode pad portion on the exit end surface and rising along a stacking direction from the electrode pad portion.

* * * * *